United States Patent
Haitz et al.

(10) Patent No.: US 10,546,983 B2
(45) Date of Patent: Jan. 28, 2020

(54) LIGHTING DEVICE HAVING A 3D SCATTERING ELEMENT AND OPTICAL EXTRACTOR WITH CONVEX OUTPUT SURFACE

(71) Applicant: Quarkstar LLC, Las Vegas, NV (US)

(72) Inventors: Roland H. Haitz, Portola Valley, CA (US); Ferdinand Schinagl, North Vancouver, B.C. (CA)

(73) Assignee: Quarkstar LLC, Las Vegas, NV (US)

( * ) Notice: Subject to any disclaimer, the term of this patent is extended or adjusted under 35 U.S.C. 154(b) by 0 days.

(21) Appl. No.: 15/529,458

(22) PCT Filed: Nov. 25, 2015

(86) PCT No.: PCT/US2015/062749
§ 371 (c)(1),
(2) Date: May 24, 2017

(87) PCT Pub. No.: WO2016/086173
PCT Pub. Date: Jun. 2, 2016

(65) Prior Publication Data
US 2017/0365753 A1 Dec. 21, 2017

Related U.S. Application Data

(60) Provisional application No. 62/084,358, filed on Nov. 25, 2014.

(51) Int. Cl.
*H01L 33/50* (2010.01)
*H01L 33/58* (2010.01)
(Continued)

(52) U.S. Cl.
CPC .............. *H01L 33/507* (2013.01); *F21K 9/60* (2016.08); *F21V 13/02* (2013.01); *G02B 5/0236* (2013.01);
(Continued)

(58) Field of Classification Search
CPC ..... H01L 33/505; H01L 33/507; H01L 33/56; H01L 33/58
See application file for complete search history.

(56) References Cited

U.S. PATENT DOCUMENTS 7,391,153 B2   6/2008 Suehiro et al.
7,879,258 B2   2/2011 De Graaf et al.
(Continued)

FOREIGN PATENT DOCUMENTS

EP    2293354 A1   3/2011
JP    2007158009 A1   6/2007
WO    WO2013078463 A1   5/2013

OTHER PUBLICATIONS

N. T. Tran et al., "Studies of Phosphor Concentration and Thickness for Phosphor-Based White Light-Emitting-Diodes", J. of Lightwave Technology, vol. 26, Issue 21, pp. 3556-3559 (2008).
(Continued)

*Primary Examiner* — Joseph M Galvin, III
(74) *Attorney, Agent, or Firm* — Fish & Richardson P.C.

(57) ABSTRACT

A lighting device includes (1) one or more solid-state lighting (SSL) devices, (2) a thick, for example prism- or cylinder- or spherical- or dome-shaped scattering element, and (3) an optical extractor with a convex output surface.

24 Claims, 5 Drawing Sheets

(51) Int. Cl.
| | |
|---|---|
| *G02B 5/02* | (2006.01) |
| *F21K 9/60* | (2016.01) |
| *F21V 13/02* | (2006.01) |
| *G02B 19/00* | (2006.01) |
| *H01L 33/56* | (2010.01) |

(52) U.S. Cl.
CPC ....... *G02B 5/0278* (2013.01); *G02B 19/0028* (2013.01); *G02B 19/0066* (2013.01); *H01L 33/505* (2013.01); *H01L 33/56* (2013.01); *H01L 33/58* (2013.01); *H01L 2933/0091* (2013.01)

(56) References Cited

U.S. PATENT DOCUMENTS 8,727,563 B2    5/2014  Berben et al.
2010/0308356 A1* 12/2010 Wirth ............... H01L 33/507 257/98
2014/0333198 A1* 11/2014 Allen ............... H01L 33/507 313/503
2015/0003059 A1* 1/2015 Haitz ............... F21V 13/02 362/235

OTHER PUBLICATIONS

V. Y. F. Leung et al., "Interplay between multiple scattering, emission, and absorption of light in the phosphor of a white light-emitting diode", Opt. Express vol. 22, No. 7, 8190-8204 (2014).

International Application No. PCT/US2015/062749, Notification of Transmittal of the International Search Report and the Written Opinion of the International Searching Authority, dated Feb. 19, 2016, 12 pages.

* cited by examiner

LIGHTING DEVICE HAVING A 3D SCATTERING ELEMENT AND OPTICAL EXTRACTOR WITH CONVEX OUTPUT SURFACE

CROSS-REFERENCE TO RELATED APPLICATIONS

This application is a U.S. National Phase application of International Application No. PCT/US2015/062749, filed on Nov. 25, 2015, which claims benefit under 35 U.S.C. § 119(e)(1) of U.S. Provisional Application No. 62/084,358, filed on Nov. 25, 2014, which are incorporated by reference herein.

TECHNICAL FIELD

The present technology pertains in general to lighting devices including solid-state lighting (SSL) devices and in particular to lighting devices including thick, for example prism- or cylinder- or spherical- or dome-shaped scattering elements and an optical extractor with a convex output surface.

BACKGROUND

The development of lighting devices has focused in many ways on how to extract as much light as possible into the ambient and while doing so provide at least some directionality of propagation to the light to make it useful for application in space illumination, indication, display and/or other lighting applications. Such aspects apply to all types of SSL and non-SSL lighting devices and generally manifest themselves in the design of the optical subsystem. These requirements are particularly relevant when light is generated within optically dense material. Efficient utilization of high brightness light that originates from quasi-point sources and controlling respective glare provides a number of challenges for optical subsystem design. These and other aspects have become increasingly important in the configuration of light-emitting diodes (LEDs), LED-based lighting devices and other SSL devices.

SSL devices in particular are finding rapid adoption in large portions of illumination applications due to their low power consumption, high luminous efficacy and longevity in comparison to incandescent and fluorescent light sources. SSL devices have been developed that can generate quality white light via down-conversion of short wavelength pump light, including ultraviolet, blue or other light provided by corresponding LEDs, via a suitable luminescent material (also referred to as a phosphor). Such devices may be referred to as phosphor-based LEDs (PLEDs). Although subject to losses in efficacy due to light-conversion, various aspects of PLEDs promise reduced complexity, better cost efficiency and durability of PLED-based luminaires in comparison to luminaires that generate white light from light emitted by various combinations of LEDs that directly generate red, green, blue, amber and/or other colors of light, for example.

While new types of phosphors are being actively investigated and developed, configuration of PLED-based lighting devices and/or luminaires, however, provides further challenges due to the properties of available luminescent materials. Challenges include light-energy losses from photon conversion, generally referred to as Stokes loss or Stokes shift, self-heating from Stokes loss, dependence of photon conversion properties on operating temperature, degradation due to permanent changes of the chemical and physical composition of phosphors in effect of overheating or other damage, dependence of the conversion properties on intensity of light, propagation of light in undesired directions in effect of the random emission of converted light that is emitted from the phosphor, undesired chemical properties of phosphors, and controlled deposition of phosphors in lighting devices, for example.

Therefore there is a need for a lighting device that overcomes at least one of the deficiencies of the state-of-the art.

SUMMARY

In general, innovative aspects of the technologies described herein can be implemented in a lighting device that includes one or more of the following aspects:

In a first aspect, a lighting device includes one or more light-emitting elements (LEE) configured to provide pump light, and a scattering element including a matrix of phosphor embedded in dielectric material. The phosphor is configured to absorb at least a portion of the pump light and to emit converted light with converted light wavelengths longer than pump light wavelengths. The dielectric material is transparent to the pump light and the converted light. The scattering element forms an input interface with the LEEs, such that the pump light emitted by the LEEs is input into the scattering element through the input interface. The input interface has a first dimension. The scattering element has a second dimension orthogonal to and 1-10 times larger than the first dimension. Additionally, the lighting device includes an optical extractor forming an extraction interface with the scattering element, such that mixed light from the scattering element is input into the optical extractor through the extraction interface. An output surface of the optical extractor is arranged and shaped relative to the extraction interface such that the mixed light received by the optical extractor through the extraction interface impinges on the output surface at incident angles smaller than or equal to the critical angle $\theta_C = \arcsin(n_E/n_O)$, where $n_E$ is a refractive index of the optical extractor, and $n_O$ is a refraction index of an environment surrounding the optical extractor.

The foregoing and other embodiments can each optionally include one or more of the following features, alone or in combination. In some implementations, the extraction interface has a third dimension being along, and 3-30 times larger than, the first dimension. In some implementations, the extraction interface is shaped as a portion of a sphere, and the second dimension of the scattering element corresponds to a radius of the sphere.

In some implementations, the phosphor can be uniformly distributed within the dielectric material. In some implementations, the dielectric material of the matrix can be plastic or glass. In some implementations, the one or more LEEs can include one or more LED dies. In some implementations, the one or more LEEs can include one or more LED packages. In some implementations, the mixed light can include a portion of the converted light and a portion of the pump light that is unconverted by the phosphor. In any of the foregoing implementations, the lighting device further can include a reflector extending from the input interface to a boundary of the extraction interface.

In some implementations, the optical extractor can be arranged and shaped relative to the extraction interface such that the incident angles at which the mixed light impinges on the extraction interface are larger than or equal to the Brewster angle $\theta_B = \arctan(n_E/n_O)$. In some implementations, the optical extractor can be arranged and shaped relative to the extraction interface such that the incident angles at which the mixed light impinges on the extraction interface are smaller than the Brewster angle $\theta_B = \arctan(n_E/n_O)$.

In a second aspect, a lighting device includes one or more light-emitting diodes (LEDs) configured to provide pump light, and a scattering element including a matrix of phosphor embedded in dielectric material. The phosphor is configured to absorb at least a portion of the pump light and to emit converted light with converted light wavelengths longer than pump light wavelengths. The dielectric material is transparent to the pump light and the converted light. The scattering element forms an input interface with the LEDs, such that the pump light emitted by the LEDs is input into the scattering element through the input interface. The input interface has a first dimension. The scattering element has a second dimension orthogonal to and 1-10 times larger than the first dimension. Additionally, the lighting device includes an optical extractor forming an extraction interface with the scattering element, such that mixed light from the scattering element is input into the optical extractor through the extraction interface. An output surface of the optical extractor has a radius $R_O$ that satisfies the condition $$R_O \geq R_E(n_E/n_O),$$

where $R_E$ is a radius of a notional sphere that inscribes the extraction interface, and wherein $n_E$ is a refractive index of the optical extractor and $n_O$ is a refraction index of an environment surrounding the optical extractor.

The foregoing and other embodiments can each optionally include one or more of the following features, alone or in combination. In some implementations, the scattering element can be shaped as a spherical dome of the notional sphere with the radius $R_E$, such that the second dimension of the scattering element corresponds to the radius $R_E$, and the optical extractor can be shaped as a spherical shell having an inner radius that corresponds to the radius $R_E$. In some implementations, the scattering element can be shaped as a cylinder having a height equal to the second dimension, and a base diameter $2R_E$ that is along, and 3-30 times larger than, the first dimension; and the optical extractor can be shaped as a spherical dome with the radius $R_O$.

In some implementations, the radius $R_O$ can satisfy the condition $$R_O = R_E(n_E/n_O).$$

In some implementations, the radius $R_O$ can satisfy the condition $$R_E(n_E/n_O) < R_O \leq R_E\sqrt{[1+(n_E/n_O)^2]}.$$

In some cases of the latter implementations, the radius $R_O$ can satisfy the condition $$R_O = R_E\sqrt{[1+(n_E/n_O)^2]}.$$

In other cases of the latter implementations, the radius $R_O$ can satisfy the condition $$R_O > R_E\sqrt{[1+(n_E/n_O)^2]}.$$

In any of the above implementations, the lighting device further can include a reflector extending from the input interface to a boundary of the extraction interface.

In some implementations, the phosphor can be uniformly distributed within the dielectric material. In some implementations, the dielectric material of the matrix can be plastic or glass. In some implementations, the one or more LEDs can include one or more LED dies. In some implementations, the one or more LEDs can include one or more LED packages. In some implementations, the mixed light can include a portion of the converted light and a portion of the pump light that is unconverted by the phosphor.

The details of one or more implementations of the technologies described herein are set forth in the accompanying drawings and the description below. Other features, aspects, and advantages of the disclosed technologies will become apparent from the description, the drawings, and the claims.

Reference numbers and designations in the various drawings indicate exemplary aspects, implementations of particular features of the present disclosure.

DETAILED DESCRIPTION

The present technology pertains to lighting devices including SSL devices, layer-shaped or three-dimensional (3D) scattering elements, and optical extractors with convex output surfaces. The disclosed lighting devices can be used in applications such as general illumination, and/or display illumination, e.g., projection displays, backlit LCDs, signage, etc.

Figure 1A:
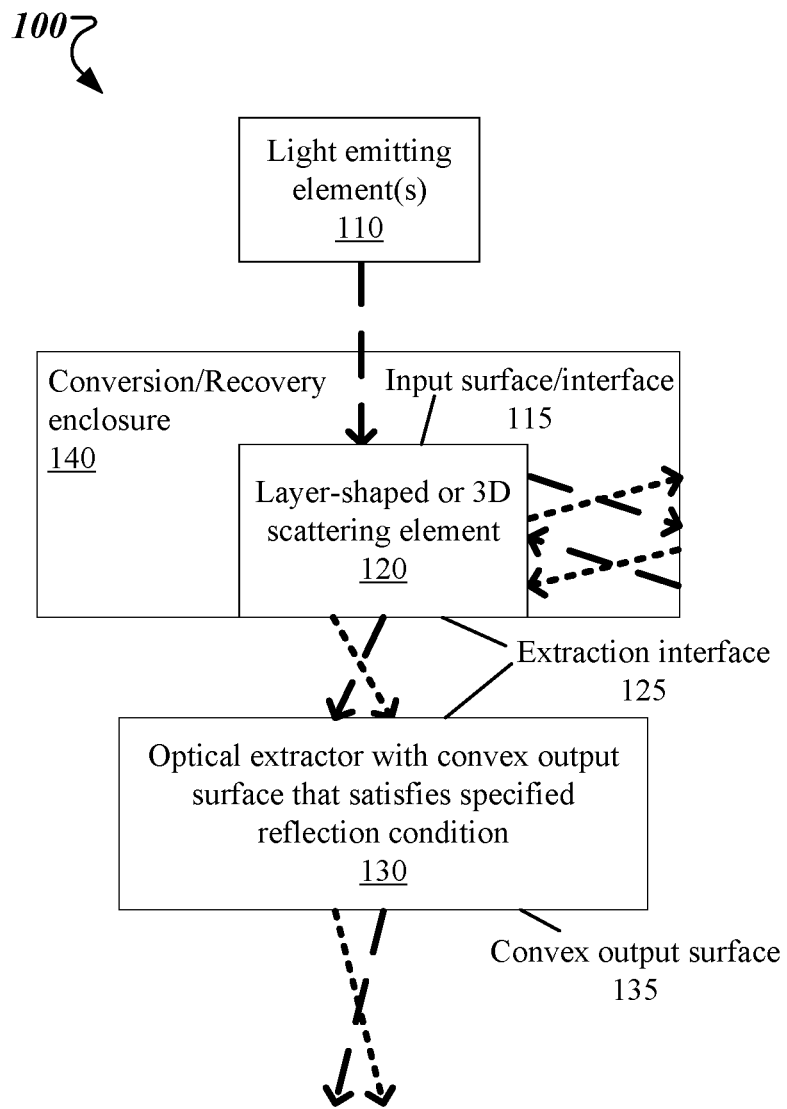
FIG. 1A shows a schematic diagram of a lighting device having a layer-shaped or 3D scattering element and an optical extractor with a convex output surface.

FIG. 1A shows a schematic diagram of a lighting device 100 having a layer-shaped or 3D scattering element 120 and an optical extractor 130 with a convex output surface 135. The lighting device 100 further includes one or more light emitting elements (LEEs) 110 and a conversion/recovery enclosure 140. The lighting device 100 efficiently provides broadband, homogenized light to an ambient environment across a broad range of angles.

The LEEs are configured to produce and emit light during operation. A spectral power distribution of light emitted by the LEEs 110 (also referred to as pump light) can be concentrated in a blue wavelength range, for instance. Depending on the context, color of light may refer to its chromaticity. In general, the LEEs 110 are devices that emit radiation in a region or combination of regions of the electromagnetic spectrum for example, the visible region, infrared and/or ultraviolet region, when activated by applying a potential difference across it or passing a current through it, for example. The LEEs 110 can have monochromatic, quasi-monochromatic, polychromatic or broadband spectral emission characteristics. Examples of LEEs that are monochromatic or quasi-monochromatic include semiconductor, organic, polymer/polymeric light-emitting diodes (LEDs). In some implementations, the one or more LEEs 110 can be a single specific device that emits the radiation, for example an LED die, or/and can be a combination of multiple instances of the specific device that emit the radiation together. Such LEE(s) 110 can include a housing or package within which the specific device or devices are placed. As another example, the one or more LEEs 110 can be a single device that includes one or more lasers and more specifically semiconductor lasers, such as vertical cavity surface emitting lasers (VCSELs) and edge emitting lasers. In embodiments utilizing semiconductor lasers, the layer-shaped or 3D scattering element 120 functions to reduce (e.g., eliminate) spatial and temporal coherence of the laser light, which may be advantageous where the lighting device 100 may be viewed directly by a person. Further examples of LEEs 110 include superluminescent diodes and other superluminescent devices.

The layer-shaped or 3D scattering element 120 has an input surface 115 positioned to receive the light from the LEEs 110. In some cases, the input surface 115 is spaced apart from the one or more LEEs 110. In other cases, the input surface 115 is an optical interface of the 3D scattering element 120 with the one or more LEEs 110. In the latter cases, the input surface 115 will be referred to as the input interface 115. The layer-shaped or 3D scattering element 120 includes scattering centers arranged to scatter the light from the LEEs 110 and to provide mixed light. Such scattering may be configured to be substantially isotropical. The mixed light can include elastically scattered pump light (represented as dashed-lines) and inelastically scattered pump light (represented as dotted-lines). Depending on its nature, scattering can be the result of combined absorption/emission and/or refractive interaction with scattering centers. Elastically scattered pump light, if any, includes photons that have undergone elastic scattering at the scattering centers. Inelastically scattered pump light includes photons that have undergone inelastic scattering at the scattering centers. For example, the spectral distribution of photons remains substantially unchanged due to elastic scattering or, on the other hand, changes in effect of inelastic scattering. Typical elastic scattering entails refraction of light at a scattering center, for example. Typical inelastic scattering entails emission of light from a scattering center in effect of light that was previously absorbed by the scattering center.

With respect to the technology described in this specification, inelastic scattering typically is associated with one visible or ultraviolet (UV) incoming photon and one visible outgoing photon. Scattering of light by a scattering center can result from effects such as light conversion, refraction, and/or other effect and/or combination thereof. The distribution of a plurality of outgoing photons that result from inelastic scattering at one scattering center can be isotropic as is typically the case, for example, in effect of light conversion. The distribution of a plurality of outgoing photons that result from elastic scattering at multiple scattering centers can be isotropic depending on, for example, shapes, arrangements and/or compositions of the scattering centers. A scattering center can include one or more portions that each scatter light in one or more ways, for example, by light conversion, refraction or other effect. Example scattering centers include discontinuities in the composition or structure of matter. In order to achieve a predetermined degree of randomness in its propagation, light has to undergo multiple elastic scattering events. As such multiple scattering events are required to exceed a predetermined randomness, for example, when the light is scattered by interaction with scattering centers that scatter light merely by refraction. Scattering centers can include light-converting material (LCM) and/or non-light converting material, for example. Light conversion via LCM is a form of inelastic scattering.

LCM is a material which absorbs photons according to a first spectral distribution and emits photons according to a second spectral distribution, as described below in connection with FIG. 1B. The terms light conversion, wavelength conversion and/or color conversion are used interchangeably. LCM is also referred to as photoluminescent or color-converting material, for example. LCM can include photoluminescent substances, fluorescent substances, phosphors, quantum dots, semiconductor-based optical converters, or the like. LCM also can include rare earth elements.

Figure 1B:
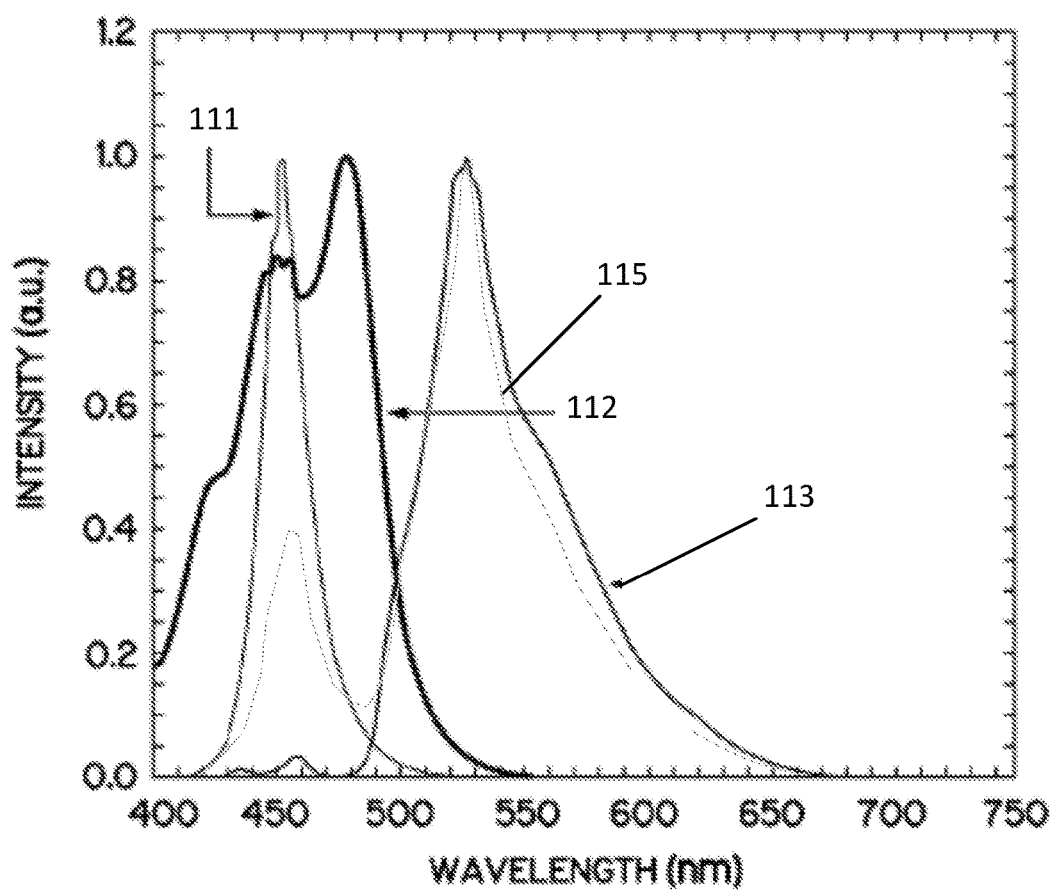
FIG. 1B shows an example of a spectrum of mixed light output by a lighting device like the one illustrated in FIG. 1A.

FIG. 1B shows an example of a spectrum 115 of mixed light that is output by the lighting device 100. A blue LED used as LEE 110 in the lighting device 100 can have an emission spectrum 111. In addition, FIG. 1B shows an absorption spectrum 112 and an emission spectrum 113 of the scattering centers, along with the spectrum of mixed light 115 (the latter is represented with a dotted-line.) Spectral power distribution of the elastically scattered light is the same as the spectral power distribution of the pump light (corresponding to the spectrum 111.) Moreover, the absorption spectrum of the scattering centers 112 overlaps the spectrum of the light emitted by the light-emitting element 111. Spectral power distribution of the inelastically scattered light is different from the pump light. For instance, inelastically scattered light will have a spectrum 113 that is shifted (e.g., Stokes shifted) to longer wavelengths than the pump light spectrum 111. For example, blue pump light, when inelastically scattered, can yield light with an overall yellow/amber color, e.g., corresponding to the spectrum 113. Moreover, the spectrum of mixed light 115 is a combination of the spectrum 111 of the elastically scattered light and spectrum 113 of the inelastically scattered light.

Referring again to FIG. 1A, the layer-shaped or 3D scattering element 120 can be configured to substantially randomize the direction of propagation of light received from LEEs 110 by scattering substantially all light entering the layer-shaped or 3D scattering element, while allowing substantial portions of light to pass through the layer-shaped or 3D scattering element.

The optical extractor 130 is formed from a transparent material, such as a transparent glass or a transparent organic polymer, and has a convex output surface 135. The output surface 135 is generally a transparent surface. In other words, changes in the mixed light passing through the output surface 135 can generally be described by Snell's law of refraction, as opposed to, for example, an opaque or diffuse surface where further scattering of transmitted light occurs. The optical extractor 130 is in contact with the layer-shaped or 3D scattering element 120, such that there is an optical interface 125 between the layer-shaped or 3D scattering element and the optical extractor at the place of contact, and the optical interface is opposite the input surface/interface 115 of the layer-shaped or 3D scattering element. The optical interface 125 is referred to as the extraction interface 125. The layer-shaped or 3D extractor element 130 is arranged so that mixed light transmitted through the extraction interface 125 enters the optical extractor 130. Light from the layer-shaped or 3D scattering element 120 that directly reaches the output surface 135 of the optical extractor 130 is referred to as forward light.

In some implementations, the lighting device 100 includes a medium, such as a gas (e.g., air), between the LEEs 110 and the input surface 115 of the layer-shaped or 3D scattering element 120 having a refractive index $n_O$, and the layer-shaped or 3D scattering element includes a material having a first refractive index $n_S$, where $n_O<n_S$. Light from the layer-shaped or 3D scattering element 120 that reaches the input surface 115 is referred to as backward light. Because $n_O<n_S$, the input surface 115 allows only a fraction of the backward light to escape into the low-index medium. Here, the transparent material of the optical extractor 130 has a refractive index $n_E$, where $n_O \leq n_E$ and is immersion-coupled with the extraction interface 125. As such, the lighting device 100 asymmetrically propagates mixed light because the amount of transmitted forward light is greater than the amount of backward light transmitted into the low index medium. In such a case, depending on the degree of asymmetry between $n_O$ and $n_E$, the extraction interface 125 between the layer-shaped or 3D scattering element 120 and the optical extractor 130 permits varying ratios of forward to backward light transmission. A high asymmetry in this ratio is reached if $n_E$ and $n_S$ are about equal. Light emitting devices that feature asymmetric optical interfaces (i.e., different refractive index mismatches) on opposing sides of the layer-shaped or 3D scattering element 120 are referred to as asymmetric scattering light valves (ASLV), or ASLV lighting devices.

The output surface 135 of the optical extractor 130 is a transparent surface that is shaped such that the mixed light that directly impinges on the output surface satisfies specified reflection conditions to ensure that the mixed light that directly impinges on the output surface experiences little or no total internal reflection (TIR). In this manner, the output surface 135 transmits a large portion of light impinging thereon that directly propagates thereto from the layer-shaped or 3D scattering element 120 and propagates in at least certain planes and outputs it into the ambient of the optical extractor 130 on first pass. The mixed light output through the output surface 135 can be used for illumination or indication functions provided by the lighting device 100 or for further manipulation by another optical system that works in conjunction with the lighting device.

Some of the specified reflection conditions satisfied by the shape of the output surface 135 of the optical extractor 130 are described below. In some embodiments, the output surface 135 of the optical extractor 130 is shaped as a spherical or a cylindrical dome or shell with a radius $R_O$, such that the extraction interface 125 is disposed within an area of the optical extractor defined by a respective notional sphere or cylinder that is concentric with the output surface and has a radius $R_W=R_O/n_E$, wherein $n_E$ is the refractive index of the optical extractor. Such a configuration is referred to as Weierstrass geometry or Weierstrass configuration. It is noted that a spherical Weierstrass geometry can avoid TIR for rays passing through the area circumscribed by a corresponding notional $R_O/n_E$ sphere irrespective of the plane of propagation. A cylindrical Weierstrass geometry can exhibit TIR for light that propagates in planes that intersect the respective cylinder axis at shallow angles even if the light passes through an area circumscribed by a corresponding notional $R_W=R_O/n_E$ cylinder.

It is noted that other lighting devices can have an extractor element 130 with non-spherical or non-cylindrical output surface 135 the can be employed to refract light and aid in shaping an output intensity distribution in ways different from those provided by a spherical or cylindrical exit surface. The definition of the Weierstrass geometry can be extended to include an output surface 135 with non-circular sections by requiring that the extraction interface 125 falls within cones, also referred to as acceptance cones, subtended from points P of the output surface whose axes correspond to respective surface normals at the points P and which have an apex of $2*\text{Arcsin}(k*n_O/n_E)$, wherein $n_O$ is the refractive index of the medium on the outside of the output surface and k is a positive number smaller than $n_E$. It is noted that the output surface 135 needs to be configured such that the plurality of all noted cones circumscribe a space with a non-zero volume. It is further noted that k is assumed to refer to a parameter that determines the amount of TIR at an uncoated output surface 135 that separates an optically dense medium, having $n_E>1$, on one side of the output surface making up the optical extractor 130 from a typical gas such as air with $n_O \sim 1.00$ at standard temperature and pressure conditions, on the outside of the output surface. Depending on the embodiment, k can be slightly larger than 1 but is preferably less than 1. If k>1, some TIR may occur at the output surface 135 inside the optical extractor 130. In some embodiments, this results in the extraction interface 125 being at least $R(P)*(1-k/n_E)$ away from the output surface 135 in a direction normal to the output surface at a point P thereof. Here, R(P) is the local radius of curvature of the output surface 135 at the point P, and $n_E$ is the refractive index of the optical extractor 130. For a spherical or cylindrical output surface 135 with k=1, the boundaries circumscribed by the noted cones correspond to a spherical or cylindrical Weierstrass geometry, respectively. In this case, the mixed light received by the optical extractor 130 through the extraction interface 125 impinges on the output surface 135 at incident angles smaller than the critical angle $\theta_C = \text{arcsin}(n_E)$. Some embodiments are configured to allow for some TIR by choosing k>1. In such cases, k/n is limited to k/n<0.8, for example. In summary, a lighting device 100 is said to satisfy the Weierstrass configuration if a radius $R_O$ of the output surface 135 of the optical extractor 130, which has an index of refraction $n_E$, is equal to or larger than $R_O \geq R_W = n_E R_E$, where $R_E$ is a radius of the extraction interface 125 of the lighting device.

In some embodiments, the parameter k is not just smaller than 1 to avoid TIR at the output surface 135 of the optical extractor 130 for light propagating in at least one plane, but k is made so small that certain Fresnel reflections are additionally avoided. In such cases, the mixed light received by the optical extractor 130 through the extraction interface 125 impinges on the output surface 135 at incident angles equal to or smaller than the Brewster angle $\theta_B = \text{arctan}(n_E)$ against an air interface. More generally, p-polarized light that impinges at a point P of the output surface 135 from within directions bound by a cone subtended from the point P with apex $2*\text{Arctan}(1/n_E)$ whose axis corresponds to the surface normal at the point P will not be reflected at the exit surface. Such a configuration is referred to as Brewster geometry (or Brewster configuration), and the output surface 135 forms a Brewster sphere or a Brewster cylinder. In summary, a lighting device 100 is said to satisfy the Brewster configuration if a radius $R_O$ of the output surface 135 of the optical extractor 130 is equal to or larger than $R_O \geq R_B = R_E(1+n_E^2)^{+1/2}$, where $R_E$ is the radius of the extraction interface 125 of the lighting device. Note that for a given radius $R_E$ of the extraction interface 125 of the lighting device 100, an optical extractor 130 that satisfies the Brewster condition has an output surface 135 with minimum radius $R_O(\text{Brewster;min})=R_B$ that is larger than a minimum radius $R_O(\text{Weierstrass;min})=R_W$ of the output surface of an optical extractor that satisfies the Weierstrass condition.

In a first implementation of the optical extractor 130, the radius $R_O$ of its output surface 135 is larger than or equal to the Brewster radius: $R_O \geq R_B = R_E(1+n_E^2)^{+1/2}$, for a given radius $R_E$ of the extraction interface 125. A volume $V_E$ of the optical extractor 130 in the first implementations can vary from a minimum volume equal to a Brewster volume, $V_E = V_B$ for $R_O = R_B$, to infinity, $V_E \to \infty$ for $R_O \to \infty$. The losses suffered by the mixed light due to Fresnel reflections at the output surface 135 (of an optical extractor 130 having a refraction index $n_E$=1.5) increase by only about 20% when the volume $V_E$ of the optical extractor 130 decreases from $\infty$ to the Brewster volume $V_B$.

In some other implementations of the optical extractor 130, the radius $R_O$ of its output surface 135 is between the Weierstrass radius $R_W = n_E R_E$, for a given radius $R_E$ of the extraction interface 125, and the Brewster radius: $R_W \leq R_O \leq R_B$. The volume $V_E$ of the optical extractor 130 in the second implementations can vary from a minimum volume equal to a Weierstrass volume, $V_E = V_W$ for $R_O = R_W$, to a maximum volume equal to the Brewster volume, $V_E = V_B$ for $R_O = R_B$. The losses suffered by the mixed light due to Fresnel reflections at the output surface 135 (of an optical extractor 130 having a refraction index $n_E$=1.5) increase by 50% while the volume of the optical extractor 130 decreases by only 20% from the Brewster volume $V_B$ to the Weierstrass volume $V_W$. In view of the foregoing volume to loss penalty considerations for the first and second implementations, some embodiments of the optical extractor 130 will have a radius of its output surface 135 that satisfies the condition $R_O \approx 1.5 R_B$, $1.2 R_B$, $1.1 R_B$, $R_B$, $0.9 R_B$, $0.8 R_B$, or $0.5 R_B$, for instance. The above estimates of the loss penalty for the optical extractor 130 as a function of its volume are described in detail in the Annex of provisional application 62/084,358 (which is incorporated by reference herein), in connection with FIG. 2B.

Figure 2A:
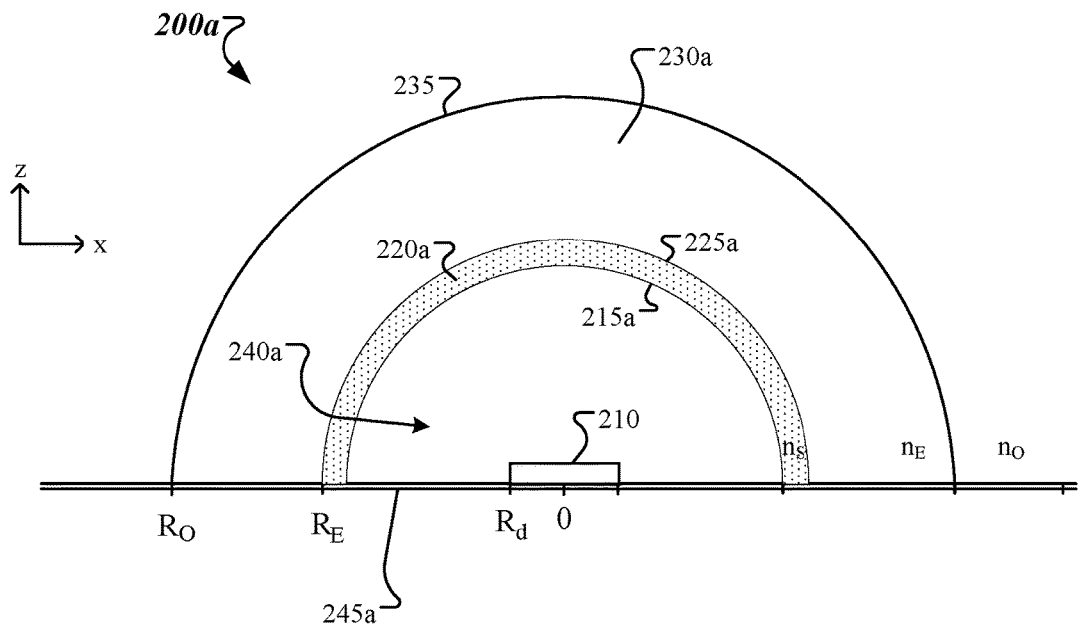
FIG. 2A shows a schematic cross section of an example of a lighting device having a spherical shell-shaped scattering element and a spherical shell-shaped optical extractor that have a common extraction interface.
Figure 2B:
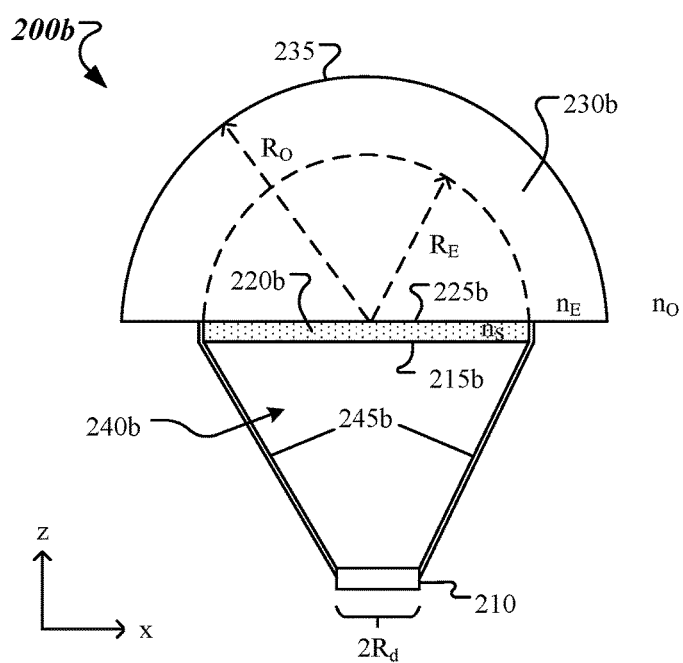
FIG. 2B shows a schematic cross section of an example of a lighting device having a plate-shaped scattering element and a spherical dome-shaped optical extractor that have a common extraction interface.
Figure 3:
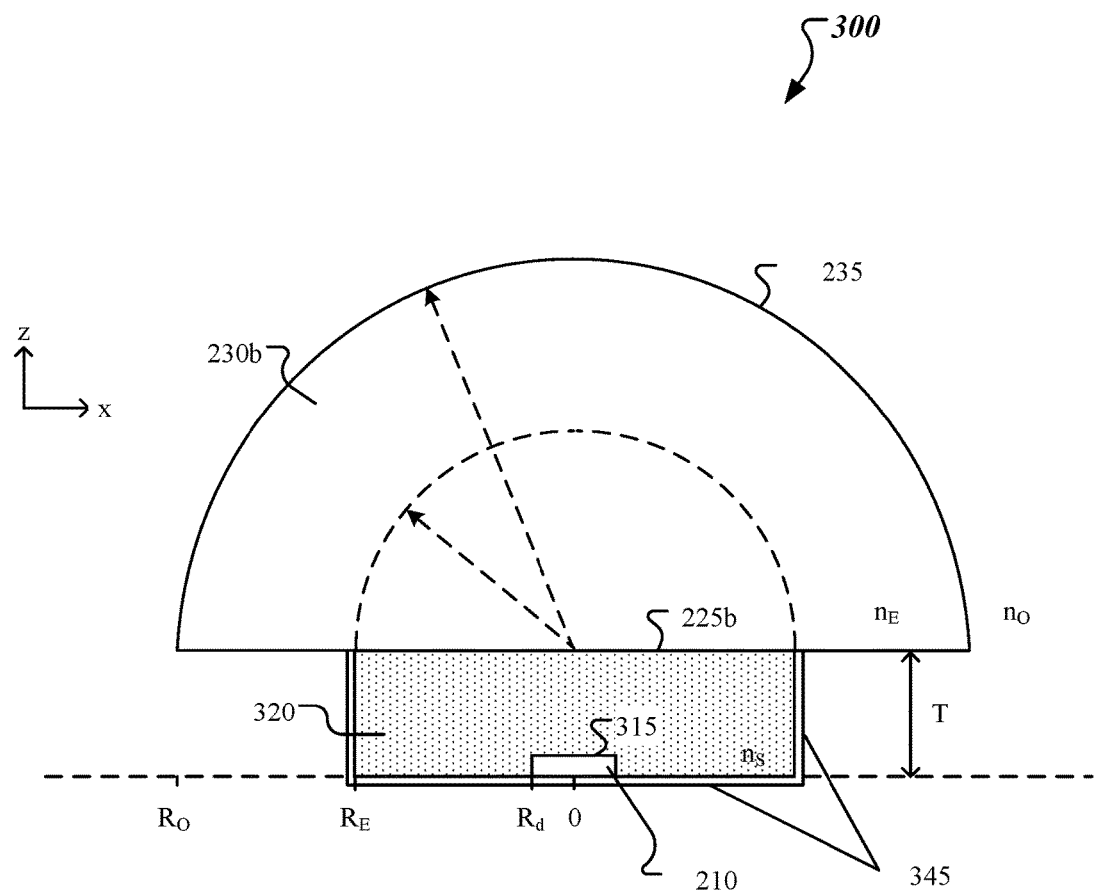
FIG. 3 shows a schematic cross section of an example of a lighting device having a cylinder-shaped scattering element and a spherical dome-shaped optical extractor that have a common extraction interface.
Figure 4:
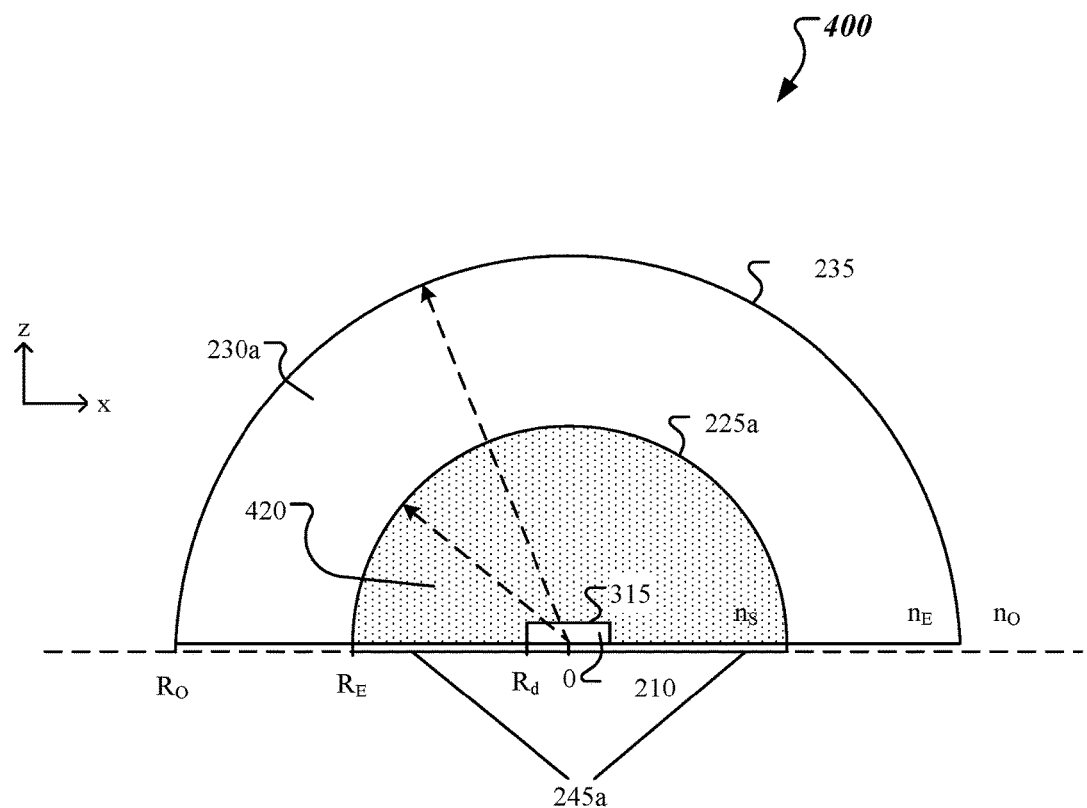
FIG. 4 shows a schematic cross section of an example of a lighting device having a spherical dome-shaped scattering element and a spherical shell-shaped optical extractor that have a common extraction interface.

Further in the example shown in FIG. 1A, the conversion/recovery enclosure 140 is defined to enclose the layer-shaped or 3D scattering element 120. The conversion/recovery enclosure 140 is arranged and configured to recover a portion of the mixed light that propagates in the backward direction by causing at least some of this mixed light to exit the layer-shaped or 3D scattering element 120 through the extraction interface 125 into the optical extractor 130, and reducing the amount of mixed light that returns to the LEEs 110 (where it can be absorbed). If a 3D scattering element 120 fully fills the conversion/recovery enclosure 140 as shown in FIGS. 3 and 4, then the conversion/recovery enclosure represents simply a conversion enclosure that is "bound" by the input interface 115, the extraction interface 125 of the 3D scattering element and one or more additional optical components that redirect back-scattered light away from the input interface. If a layer-shaped scattering element 120 does not fully fill the conversion/recovery enclosure 140 as shown in FIGS. 2A and 2B, then the conversion/recovery enclosure also encloses a medium adjacent the input surface 115 of the layer-shaped scattering element. In one such example illustrated in FIG. 2A, the conversion/recovery enclosure 240a is bound by the extraction interface 225a and a reflector 245a. In another such example illustrated in FIG. 2B, the conversion/recovery enclosure 240b is bound by the extraction interface 225b and side surfaces 245b of an optical coupler 245b. Referring again to FIG. 1A, note that the backscattered light recovered from the conversion/recovery enclosure 140 further increases asymmetry in the propagation of light through the lighting device 100.

Moreover, the lighting device 100 can be fabricated using conventional extrusion and molding techniques and conventional or other assembly techniques—some examples are described herein. Components of the lighting device 100 can include one or more organic or inorganic materials, for example acrylic, silicone, polypropylene (PP), polyethylene terephthalate (PET), polycarbonate, polyvinylidene fluoride such as Kynar™, lacquer, acrylic, rubber, polyphenylene sulfide (PPS) such as Ryton™, polysulfone, polyetherimide (PEI), polyetheretherketone (PEEK), polyphenylene oxide (PPO) such as Noryl™, glass, quartz, silicate, adhesive, other polymers organic or inorganic glasses and/or other materials.

In some embodiments, the optical extractor 130 and the layer-shaped or 3D scattering element 120 are integrally formed. In an example of such an integral formation, the extraction interface 125 is a notional interface drawn between regions of a corresponding integrally formed object, such that the extraction interface substantially includes interfaces formed by the scattering centers. This may be the case, when the layer-shaped or 3D scattering element 120 includes scattering centers inside a material that is the same as the material used to form the optical extractor 130, for example. In this manner, the layer-shaped or 3D scattering element 120 can be shaped as a tile, disc, spherical or aspherical shell or dome, tubular, prismatic or other elongate shell, or other structure to provide a predetermined spatial profile of conversion properties to achieve a predetermined light-output profile including color and/or brightness homogeneity from the layer-shaped or 3D scattering element.

The layer-shaped or 3D scattering element 120 can be adjacent to, or partially or fully surrounded by, the optical extractor 130. Various shapes of the layer-shaped or 3D scattering element 120 and of the optical extractor 130, and their combinations, are described in detail below in connection with FIGS. 2A, 2B, 3 and 4.

FIG. 2A shows a schematic cross section in the x-z plane of a lighting device 200a having a spherical shell-shaped scattering element 220a and a spherical shell-shaped optical extractor 230a that have a common extraction interface 225a. In some implementations, the lighting device 200a has rotational symmetry around the z-axis. In other implementations, the lighting device 200a is elongated along the y-axis (i.e., along a direction perpendicular to the page). The lighting device 200a further includes one or more LEEs 210 (e.g., a blue pump), and a flat reflector 245a (e.g., a mirror represented by a double line.) The scattering element 220a has an input surface 215a spaced apart from the LEEs 210 and positioned to receive the light from the LEEs. In this example, an LEE 210 is inserted into an opening (e.g., having a half-width $R_d$) of the flat reflector 245a. A dimension $2R_d$ in the x-y plane of the LEE 210 can be of order 1 mm, for instance. In some implementations, the reflector 245a extends to at least the input surface 215a of the scattering element 220a. In other implementations, the reflector 245a extends to at least an output surface 235 of the optical extractor 230a. In this example, the spherical shell-shaped scattering element 220a is located on the inside of the optical extractor 230a and has substantially uniform thickness, such that a distance between the extraction interface 225a and the input surface 215a of the scattering element is constant for any point of the optical extraction. The thickness of the spherical shell-shaped scattering element 220a is less than 1 mm, e.g., 0.5, 0.2 , 0.1 mm, or other thicknesses. Note that, in this example, the thickness of the spherical shell-shaped scattering element 220a is about 3×-10× smaller than the dimension $2R_d$ of the LEE 210. As such, the spherical shell-shaped scattering element 220a is first embodiment of the layer-shaped scattering element 120 described above in connection with FIG. 1A.

Moreover, the input surface 215a of the spherical shell-shaped scattering element 220a is adjacent an air filled semispherical enclosure 240a of the optical extractor 230a. The enclosure 240a encompasses the LEE 210 and its surrounding reflector 245a. Here, a radius $R_E$ of the extraction interface 225a can be of order 3-5 mm. In some implementations, the output surface 235 of the extractor element 230a is concentric with the extraction interface 225a and has a radius $R_O$ that satisfies one of the following reflection conditions. Reflection condition 1: $R_O > R_B$, where the Brewster radius $R_B$ is related to the radius $R_E$ of the extraction interface 225a through $R_B = R_E(1+n_E^2)^{+1/2}$; Reflection condition 2: $R_O = R_B$; Reflection condition 3: $R_W < R_O < R_B$, where the Weierstrass radius $R_W$ is related to the radius $R_E$ of the extraction interface through $R_W = n_E R_E$; Reflection condition 4: $R_O = R_W$. In this manner, mixed light that directly impinges on the output surface 235 experiences little or no total internal reflection thereon.

Further in this example, light propagation asymmetry in large part arises from the refraction indices of materials on the inside (index $n_O$) and outside (index $n_E$) of the spherical shell-shaped scattering element 220a (with index $n_s$) being unequal. For instance, if $1.3 < n_S < 1.6$ and $n_O = 1.0$, that is $n_O < n_S$, a large fraction (~75%) of the isotropically distributed mixed light impinging on the input surface 215a will be reflected by TIR back into the spherical shell-shaped scattering element 220a and only a smaller fraction (~25%) will be transmitted backwards into the air medium of the recovery enclosure 240a from where some may reach the LEE 210. In some implementations, at the extraction interface 225a, the condition $n_S \leq n_E$ will guarantee that substantially all the mixed light reaching the extraction interface will transition into the extractor element 230a, and either of the above-noted reflection conditions 1, 2, 3 or 4 will further guarantee that practically all the mixed light will transmit into air without TIR through the output surface 235. Only a small fraction (down to about ~4% depending on incidence angle) will be returned by Fresnel reflection at the output surface 235.

FIG. 2B shows a schematic cross section of an example of a lighting device 200b having a plate-shaped scattering element 220b and a spherical dome-shaped optical extractor 230b that have a common extraction interface 225b. In some implementations, the lighting device 200b has rotational symmetry around the z-axis. In other implementations, the lighting device 200b is elongated along the y-axis (i.e., along a direction perpendicular to the page). The lighting device 200b further includes one or more LEEs 210 (e.g., a blue pump), and an optical coupler 245b (e.g., configured as a compound parabolic collector (CPC), a conical or other hollow optical coupler having reflective side surfaces represented by double lines.) Note that an air filled enclosure 240b of the optical coupler 245b encompasses an LEE 210 and the plate-shaped scattering element 220b. Here, the LEE 210 is positioned at an input aperture of the optical coupler 245b. A dimension $2R_d$ in the x-y plane of the LEE 210 can be of order 1 mm, for instance. The plate-shaped scattering element 220b is positioned at an output aperture of the optical coupler 245b and has an input surface 215b through which it receives the pump light from the LEE 210. In this example, the plate-shaped scattering element 220b has substantially uniform thickness, such that a distance between the extraction interface 225b and the input surface 215b of the plate-shaped scattering element is constant for any point of the optical extraction. The thickness of the plate-shaped scattering element 220b is less than 1 mm, e.g., 0.5, 0.2, 0.1 mm, or other thicknesses. Note that, in this example, the thickness of the plate-shaped scattering element 220b is about 3×-10× smaller than the dimension $2R_d$ of the LEE 210. Additionally, a dimension $2R_E$ in the x-y plane of the scattering element 220b can be of order 3-5 mm. As such, the plate-shaped scattering element 220b is a second embodiment of the layer-shaped scattering element 120 described above in connection with FIG. 1A.

Note that the extraction interface 225b is inscribed in (i.e., forms a chord of) a nominal sphere (represented in dashed-line) that is concentric with the output surface 235 of the optical extractor 230b. The largest such nominal sphere has a diameter equal to the dimension $2R_E$ in the plane x-y of the extraction interface 225b. In the current disclosure, a radius $R_O$ of the output surface 235 satisfies one of the following reflection conditions. Reflection condition 1: $R_O > R_B$, where the Brewster radius $R_B$ is related to the dimension $2R_E$ of the extraction interface 225b through $R_B = R_E(1+n_E^2)^{+1/2}$; Reflection condition 2: $R_O = RB$; Reflection condition 3: $R_W < R_O < R_B$, where the Weierstrass radius $R_W$ is related to the dimension $2R_E$ of the extraction interface through $R_W = n_E R_E$; Reflection condition 4: $R_O = R_W$. In this manner, mixed light that directly impinges on the output surface 235 experiences little or no total internal reflection thereon.

Further in this example, light propagation asymmetry arises mostly from the refraction indices of materials on the inside (index $n_O$) and outside (index $n_E$) of the plate-shaped scattering element 220b (with index $n_S$) being unequal. For instance, if $1.3 < n_S < 1.6$ and $n_O = 1.0$, that is $n_O < n_S$, a large fraction (~75%) of the isotropically distributed mixed light impinging on the input surface 215b will be reflected by TIR back into the plate-shaped scattering element 220b and only a smaller fraction (~25%) will be transmitted backwards into the air medium of the recovery enclosure 240b from where some may reach the LEE 210. In some implementations, at the extraction interface 225b, the condition $n_S \leq n_E$ will guarantee that substantially all the mixed light reaching the extraction interface will transition into the optical extractor 230b, and either of the above-noted reflection conditions 1, 2, 3 or 4 will further guarantee that practically all the mixed light will transmit into air without TIR through the output surface 235. Only a small fraction (down to about ~4% depending on incidence angle) will be returned by Fresnel reflection at the output surface 235.

As noted above, the lighting device 200a has a spherical shell-shaped scattering element 220a and the lighting device 200b has a plate-shaped scattering element 220b, each of these layer-shaped scattering elements can have a thickness comparable to a characteristic dimension of the LEEs 210. The lighting devices described below have 3D scattering elements with a thickness that can be a few to many times a characteristic dimension of the LEEs.

For example, FIG. 3 shows a schematic cross section of a lighting device 300 having a thick, for example cylinder-shaped, scattering element 320 and a spherical dome-shaped optical extractor 230b that have a common extraction interface 225b. The cylinder-shaped scattering element 320 is an example embodiment of the 3D scattering element 120 described above in connection with FIG. 1A. As another example, FIG. 4 shows a schematic cross section of an example of a lighting device 400 having a spherical dome-shaped scattering element 420 and a spherical shell-shaped optical extractor 230a that have a common extraction interface 225a. The spherical dome-shaped scattering element 420 is another embodiment of the 3D scattering element 120 described above in connection with FIG. 1A. In some implementations, the lighting device 300/400 has rotational symmetry around the z-axis. In other implementations, the lighting device 300/400 is elongated along the y-axis (i.e., along a direction perpendicular to the page).

The lighting device 300/400 further includes one or more LEEs 210. As described above in connection with FIG. 1A, the LEE(s) 210 can include light emitting diodes (LEDs). For example, the LEDs can emit pump light, as described above in connection with FIG. 1B. In some cases, the LEDs can be bare LED dies. In some other cases, the LEDs can be packaged LED dies. In the latter cases, the packaged LED dies can include a lens or other light shaping optical element.

The 3D scattering element 320/420 can include a matrix of phosphor particles embedded in dielectric material. The phosphor can absorb a portion of the pump light and emit converted light with converted light wavelengths longer than pump light wavelengths, as illustrated in FIG. 1B, for instance. Here, the dielectric material is transparent to the pump light and the converted light. In this manner, the 3D scattering element 320/420 provides mixed light which includes a portion of the converted light and a portion of the pump light that is not absorbed by the phosphor, as illustrated in FIG. 1B, for instance. In some implementations, the dielectric material of the matrix is plastic. In other implementations, the dielectric material of the matrix is glass. Moreover, the phosphor particles can be uniformly distributed in the dielectric material. In this manner, an effective refracting index of the 3D scattering element 320/420 is $n_S>1$, e.g., $1.3<n_S<1.6$.

The optical extractor 230b/230a can include a material that is transparent to the mixed light and has a refractive index $n_E$ that is larger than a refraction index $n_O$ of an environment surrounding the optical extractor. The material of the optical extractor 230b/230a can be plastic or glass. A value of the refractive index $n_E$ of the optical extractor material is in the range of $1.3<n_E<1.9$, for instance. In some implementations, $n_E$ can be smaller than ns. In other implementations, $n_E$ can be equal to or larger than $n_S$.

Further, the 3D scattering element 320/420 can form an immersion-coupled input interface 315 with the LEE(s) 210, such that the pump light emitted by the LEE(s) is input into the 3D scattering element through the input interface. Furthermore, the optical extractor 230b/230a forms an immersion-coupled extraction interface 225b/225a with the 3D scattering element 320/420, such that the mixed light is input into the optical extractor from the 3D scattering element through the extraction interface. Moreover, an output surface 235 of the optical extractor 230b/230a is arranged and shaped relative to the extraction interface 225b/225a such that the mixed light received by the optical extractor through the extraction interface impinges on the output surface at incident angles smaller than a predetermined angle. Examples of predetermined angles corresponding to particular reflection conditions are provided below in this specification.

The lighting device 300/400 further includes a reflector 345/245a (represented in FIGS. 3 and 4 by double lines) extending from the input interface 315 to a boundary of the extraction interface 225b/225a. In this manner, a cylinder-shaped conversion chamber (corresponding to the conversion enclosure 140 of the lighting device 100 shown in FIG. 1A) of the lighting device 300 shown in FIG. 3 is bounded by the reflector 345 and the extraction interface 225b and encloses the cylinder-shaped scattering element 320. Further, a spherical dome-shaped conversion chamber (taking the position of the conversion enclosure 140 of the lighting device 100 shown in FIG. 1A) of the lighting device 400 shown in FIG. 4 is bounded by the reflector 245a and the extraction interface 225a and encloses the spherical dome-shaped scattering element 420. In some implementations, the reflector 245a can extend along the x-axis beyond the boundary of the extraction interface 225a at least to the boundary of the output surface 235. The reflector 345/245a can be configured to reflect the mixed light via specular reflection or diffuse reflection. A reflectivity of the reflector 345/245a is larger than 90%, e.g., 95%, 99%, etc. In some implementations the reflectors 345/245a provide a white diffuse reflective surface, which, when immersion coupled with the scattering element 320/420, can provide very high reflectivity.

Moreover, the input interface 315 has a first dimension, $2R_d$. In the examples illustrated in FIGS. 3 and 4, the first dimension $2R_d$ is in the x-y plane and can represent a length of the LED die or LED package that forms the LEE 210. The first dimension $2R_d$ is of order 1 mm, for instance.

Referring now to FIG. 3, the cylinder-shaped scattering element 320 has a second dimension, T, which is orthogonal to and 1-10 times larger than the first dimension $2R_d$ of the input interface 315. Here, the second dimension T represents a thickness along the z-axis of the cylinder-shaped scattering element 320. Additionally, the cylinder-shaped scattering element 320 has a third dimension, $2R_E$, which is along and 3-30 times larger than the first dimension $2R_d$ of the input interface 315. Here, the third dimension $2R_E$ represents a length in the x-y plane of the cylinder-shaped scattering element 320. In this example, the extraction interface 225b also has the third dimension $2R_E$ in the x-y plane.

In this example, the extraction interface 225b is inscribed in (i.e., forms a chord of) a nominal sphere (represented in dashed-line) that is concentric with the output surface 235 of the spherical dome-shaped optical extractor 230b. The largest such nominal sphere has a diameter equal to the third dimension $2R_E$ in the plane x-y of the extraction interface 225b. In the current disclosure, a radius $R_O$ of the output surface 235 satisfies one of the following reflection conditions. Reflection condition 1: $R_O>R_B$, where the Brewster radius $R_B$ is related to the third dimension $2R_E$ of the extraction interface 225b through $R_B=R_E(1+n_E^2)^{+1/2}$; Reflection condition 2: $R_O=R_B$; Reflection condition 3: $R_W<R_O<R_B$, where the Weierstrass radius $R_W$ is related to the third dimension $2R_E$ of the extraction interface through $R_W=n_E R_E$; Reflection condition 4: $R_O=R_W$. In this manner, mixed light that directly impinges on the output surface 235 of the spherical dome-shaped optical extractor 230b experiences little or no total internal reflection thereon for the following reasons. For all reflection conditions 1-4, the mixed light directly impinges on the output surface 235 at incidence angles smaller than or equal to the critical angle $\theta_C=\arcsin(n_E/n_O)$. Moreover, for conditions 1-2, the mixed light directly impinges on the output surface 235 at incidence angles smaller than or equal to the Brewster angle $\theta_B=\arctan(n_E/n_O)$.

Referring now to FIG. 4, the scattering element 420 can be a dome-shaped hemi-sphere. Here, the dome-shaped scattering element 420 has a second dimension, $R_E$, which is radial with respect to the input interface 315 and 1-10 times larger than the first dimension $2R_d$ of the input interface. Here, the second dimension $R_E$ represents a radius of the extraction interface 225a. Additionally, the spherical dome-shaped scattering element 420 has a third dimension which coincides with a length of the extraction interface 225a. Here, the length of the extraction interface 225a is $\sim\pi R_E$, e.g., 3-30 times larger than the first dimension $2R_d$ of the input interface 315.

In some implementations, the output surface 235 of the spherical shell-shaped optical extractor 230a is concentric with the extraction interface 225a and has a radius $R_O$ that satisfies one of the following reflection conditions. Reflection condition 1: $R_O > R_B$, where the Brewster radius $R_B$ is related to the radius $R_E$ of the extraction interface 225a through $R_B = R_E(1+n_E^2)^{+1/2}$; Reflection condition 2: $R_O = R_B$; Reflection condition 3: $R_W < R_O < R_B$, where the Weierstrass radius $R_W$ is related to the radius $R_E$ of the extraction interface through $R_W = n_E R_E$; Reflection condition 4: $R_O = R_W$. In this manner, mixed light that directly impinges on the output surface 235 of the spherical shell-shaped optical extractor 230a experiences little or no total internal reflection thereon for the following reasons. For all reflection conditions 1-4, the mixed light directly impinges on the output surface 235 at incidence angles smaller than or equal to the critical angle $\theta_C = \arcsin(n_E/n_O)$. Moreover, for conditions 1-2, the mixed light directly impinges on the output surface 235 at incidence angles smaller than or equal to the Brewster angle $\theta_B = \arctan(n_E/n_O)$.

Note that, in contrast with the lighting device 300 having a cylinder-shaped scattering element 320 with a thickness T (orthogonal to the input interface 315) that is larger than the dimension $2R_d$ of its LEE 210, e.g., $T = 1-10 \times 2R_d$, the corresponding lighting device 200b has a plate-shaped scattering element 220b with a thickness that represents a fraction of the dimension $R_d$ of its LEE 210, e.g., ~0.5–0.1× $2R_d$. Similarly, in contrast with the lighting device 400 having a spherical dome-shaped scattering element 420 with a radius $R_E$ that is larger than the dimension $2R_d$ of its LEE 210, e.g., $R_E = 1-10 \times 2R_d$, the corresponding lighting device 200a has a spherical shell-shaped scattering element 220a with a thickness that represents a fraction of the dimension $R_d$ of its LEE 210, e.g., ~0.5–0.1× $2R_d$. While the 3D scattering element 320/420 of the lighting device 300/400 and the layer-shaped scattering element 220b/220a of the corresponding lighting device 200b/200a may contain similar quantities of phosphor, a volume of the former can be much larger than a volume of the latter. Hence, the phosphor in the 3D scattering element 320/420 of the lighting device 300/400 can be more dilute than the phosphor in the layer-shaped scattering element 220b/220a of the corresponding lighting device 200b/200a. Likewise, the mean free path lengths can be longer. In this manner, a likelihood for the converted light to backscatter towards the input interface 315 for the lighting device 300/400 is beneficially smaller than a likelihood for the converted light to backscatter towards the input interface 215b/215a for the corresponding lighting device 200b/200a. As such, in the case of the lighting device 300/400, a remaining portion of the backscattered light is reflected off the reflector 345/245a (which has a higher reflectance than a surface of an LEE 210—that is the input interface 315 as viewed from the 3D scattering element 320/420.) Additionally, a likelihood for the converted light—that scatters laterally (e.g., in the x-y plane) relative to a forward direction (e.g., along the z-axis) between the input interface 315 and the extraction interface 225b/225a—to be absorbed for the lighting device 300/400 is beneficially smaller than a likelihood for the converted light—that scatters laterally (e.g., in the tangential direction/x-y plane) relative to a forward direction (e.g., along the radial direction/z-axis) between the input interface 215b/215a and the extraction interface 225b/225a—to be absorbed for the corresponding lighting device 200b/200a. In this manner, in the case of the lighting device 300/400, a remaining portion of the laterally scattered converted light is reflected off the reflector 345/245a. Additionally, larger mean free path lengths in the 3D scattering element 320/420 than in the corresponding layer-shaped scattering element 220b/220a allow for better spreading of light across the extraction interface 225b/225a. This can provide greater uniformity in brightness and/or color, for example.

As such, contributions to increasing the efficiency of the lighting device 300/400 over the corresponding lighting device 200b/200a come from an effective conversion cavity enclosing the 3D scattering element 320/420. Depending on the embodiment, the thickness of the scattering element may be half to twice the mean free path length and about one to ten times the first dimension of the input interface. The foregoing embodiments of the technology can be varied in many ways. Such present or future variations are not to be regarded as a departure from the spirit and scope of the technology, and all such modifications as would be obvious to one skilled in the art are intended to be included within the scope of the following claims.

The preceding figures and accompanying description illustrate example methods, systems and devices for illumination. It will be understood that these methods, systems, and devices are for illustration purposes only and that the described or similar techniques may be performed at any appropriate time, including concurrently, individually, or in combination. In addition, many of the steps in these processes may take place simultaneously, concurrently, and/or in different orders than as shown. Moreover, the described methods/devices may use additional steps/parts, fewer steps/parts, and/or different steps/parts, as long as the methods/devices remain appropriate.

In other words, although this disclosure has been described in terms of certain aspects or implementations and generally associated methods, alterations and permutations of these aspects or implementations will be apparent to those skilled in the art. Accordingly, the above description of example implementations does not define or constrain this disclosure. Further implementations are described in the following claims.

The invention claimed is:
1. A lighting device comprising:
one or more light-emitting elements (LEEs) configured to provide pump light;
a scattering element comprising a matrix of phosphor embedded in dielectric material, wherein the phosphor is configured to absorb at least a portion of the pump light and to emit converted light with converted light wavelengths longer than pump light wavelengths, and the dielectric material is transparent to the pump light and the converted light, the scattering element forming an input interface in contact with the one or more LEEs, such that the pump light emitted by the one or more LEEs is input into the scattering element through the input interface, wherein the input interface has a first dimension, and wherein the scattering element has a second dimension orthogonal to and 1-10 times larger than the first dimension; and
an optical extractor forming an extraction interface in contact with the scattering element, such that mixed light from the scattering element is input into the optical extractor through the extraction interface, wherein an output surface of the optical extractor is arranged and shaped relative to the extraction interface such that the mixed light received by the optical extractor through the extraction interface impinges on the output surface at incident angles smaller than or equal to the critical angle $\theta_C = \arcsin(n_E/n_O)$, wherein

$n_E$ is a refractive index of the optical extractor and $n_O$ is a refraction index of an environment surrounding the optical extractor.

2. The lighting device of claim 1, wherein the extraction interface has a third dimension being along, and 3-30 times larger than, the first dimension.

3. The lighting device of claim 1, wherein the extraction interface is shaped as a portion of a sphere, and the second dimension of the scattering element corresponds to a radius of the sphere.

4. The lighting device of claim 1, wherein the phosphor is uniformly distributed within the dielectric material.

5. The lighting device of claim 1, wherein the dielectric material of the matrix is plastic or glass.

6. The lighting device of claim 1, wherein the one or more LEEs include one or more LED dies.

7. The lighting device of claim 1, wherein the one or more LEEs include one or more LED packages.

8. The lighting device of claim 1, wherein the mixed light comprises a portion of the converted light and a portion of the pump light that is unconverted by the phosphor.

9. The lighting device of claim 1, further comprising a reflector extending from the input interface to a boundary of the extraction interface.

10. The lighting device of claim 1, wherein the optical extractor is arranged and shaped relative to the extraction interface such that the incident angles at which the mixed light impinges on the output surface are larger than or equal to the Brewster angle $\theta_B=\arctan(n_E/n_O)$.

11. The lighting device of claim 1, wherein the optical extractor is arranged and shaped relative to the extraction interface such that the incident angles at which the mixed light impinges on the output surface are smaller than the Brewster angle $\theta_B=\arctan(n_E/n_O)$.

12. A lighting device comprising:
one or more light-emitting diodes (LEDs) configured to provide pump light;
a scattering element comprising a matrix of phosphor embedded in dielectric material, wherein the phosphor is configured to absorb at least a portion of the pump light and to emit converted light with converted light wavelengths longer than pump light wavelengths, and the dielectric material is transparent to the pump light and the converted light, the scattering element forming an input interface in contact with the one or more LEDs, such that the pump light emitted by the one or more LEDs is input into the scattering element through the input interface, wherein the input interface has a first dimension, and wherein the scattering element has a second dimension orthogonal to and 1-10 times larger than the first dimension; and
an optical extractor forming an extraction interface in contact with the scattering element, such that mixed light from the scattering element is input into the optical extractor through the extraction interface, wherein an output surface of the optical extractor has a radius $R_O$ that satisfies the condition $$R_O \geq R_E(n_E/n_O),$$

wherein $R_E$ is a radius of a notional sphere that inscribes the extraction interface, and wherein $n_E$ is a refractive index of the optical extractor and $n_O$ is a refraction index of an environment surrounding the optical extractor.

13. The lighting device of claim 12, wherein
the scattering element is shaped as a spherical dome of the notional sphere with the radius $R_E$, such that the second dimension of the scattering element corresponds to the radius $R_E$, and
the optical extractor is shaped as a spherical shell having an inner radius that corresponds to the radius $R_E$.

14. The lighting device of claim 12, wherein
the scattering element is shaped as a cylinder having a height equal to the second dimension, and a base diameter $2R_E$ that is along, and 3-30 times larger than, the first dimension, and
the optical extractor is shaped as a spherical dome with the radius $R_o$.

15. The lighting device of claim 12, wherein the radius $R_O$ satisfies the condition $$R_O = R_E(n_E/n_O).$$

16. The lighting device of claim 12, wherein the radius $R_O$ satisfies the condition $$R_E(n_E/n_O) < R_O \leq R_E\sqrt{1+(n_E/n_O)^2}.$$

17. The lighting device of claim 16, wherein the radius $R_O$ satisfies the condition $$R_O = R_E\sqrt{1+(n_E/n_O)^2}.$$

18. The lighting device of claim 16, wherein the radius $R_O$ satisfies the condition $$R_O > R_E\sqrt{1+(n_E/n_O)^2}.$$

19. The lighting device of claim 12, further comprising a reflector extending from the input interface to a boundary of the extraction interface.

20. The lighting device of claim 12, wherein the phosphor is uniformly distributed within the dielectric material.

21. The lighting device of claim 12, wherein the dielectric material of the matrix is plastic or glass.

22. The lighting device of claim 12, wherein the one or more LEDs include one or more LED dies.

23. The lighting device of claim 12, wherein the one or more LEDs include one or more LED packages.

24. The lighting device of claim 12, wherein the mixed light comprises a portion of the converted light and a portion of the pump light that is unconverted by the phosphor.

* * * * *